United States Patent [19]

Donohoe

[11] Patent Number: 5,759,922
[45] Date of Patent: Jun. 2, 1998

[54] CONTROL OF ETCH PROFILES DURING EXTENDED OVERETCH

[75] Inventor: Kevin Donohoe, Boise, Id.

[73] Assignee: Micron Technology, Inc., Boise, Id.

[21] Appl. No.: 781,472

[22] Filed: Jan. 10, 1997

Related U.S. Application Data

[63] Continuation of Ser. No. 388,093, Feb. 14, 1995, abandoned, which is a continuation-in-part of Ser. No. 112,017, Aug. 25, 1993, abandoned.

[51] Int. Cl.$^6$ .................................................. H01L 21/00
[52] U.S. Cl. .................... 438/731; 438/733; 438/719; 156/346 C; 204/192.37; 204/298.31
[58] Field of Search .................... 156/643.1, 345 C, 156/659.1, 662.1, 655.1; 204/192.32, 192.35, 192.37, 298.01, 298.31; 438/731, 719, 730, 733

[56] References Cited

U.S. PATENT DOCUMENTS

| | | | |
|---|---|---|---|
| 4,431,898 | 2/1984 | Reinberg et al. | 219/121 PG |
| 4,891,118 | 1/1990 | Ooiwa et al. | 204/192.32 X |
| 4,915,979 | 4/1990 | Ishida et al. | 156/646.1 |
| 4,918,031 | 4/1990 | Flamm et al. | 156/643.1 |
| 4,960,073 | 10/1990 | Suzuki et al. | 156/345 X |
| 5,024,716 | 6/1991 | Sato | 156/345 |
| 5,091,049 | 2/1992 | Campbell et al. | 156/643 |
| 5,182,495 | 1/1993 | Fukuda et al. | 315/111.41 |
| 5,194,119 | 3/1993 | Iwano et al. | 156/643.1 |
| 5,198,725 | 3/1993 | Chen et al. | 315/111.41 |
| 5,200,232 | 4/1993 | Tappan et al. | 118/723 MR |
| 5,211,825 | 5/1993 | Saito et al. | 204/192.32 |
| 5,236,853 | 8/1993 | Hsue | 437/43 |
| 5,242,536 | 9/1993 | Schoenborn | 156/643 |
| 5,242,539 | 9/1993 | Kumihashi et al. | 156/643 |
| 5,243,259 | 9/1993 | Sato et al. | 315/111.41 |
| 5,304,775 | 4/1994 | Fujiwara et al. | 156/643.1 |
| 5,336,365 | 8/1994 | Goda et al. | 156/643 |
| 5,346,578 | 9/1994 | Benzig et al. | 156/345 C |
| 5,429,070 | 7/1995 | Campbell et al. | 156/345 C |
| 5,474,650 | 12/1995 | Kumihashi et al. | 156/643.1 |

FOREIGN PATENT DOCUMENTS

| | | | |
|---|---|---|---|
| 516043 | 12/1992 | European Pat. Off. | 156/646.1 |
| 193126 | 8/1987 | Japan . | |
| 318127 | 12/1988 | Japan . | |
| 36527 | 2/1990 | Japan . | |
| 3290926 | 12/1991 | Japan . | |

OTHER PUBLICATIONS

Singer, Peter H. "ECR: Is the magic gone?" Semiconductor International (Jul. 1991) pp. 46–48.

Kure, T. et al. "Highly Anisotropic Microwave Plasma Etching for High Packing Density Silicon Patterns"., 1992 Symposium on VLSI Technology Digest of Technical Papers (1992), pp. 48–49.

Nozawa, T. et al. "ECR Plasma Etching of N+Polysilicon Gate", Abstract No. 245, pp. 356–357.

*Primary Examiner*—Martin Angebranndt
*Attorney, Agent, or Firm*—Lia Pappas Dennison; W. Eric Webostad

[57] ABSTRACT

An etch process to substantially eliminate notching in submicron features by exposing a wafer to a chlorine plasma; operating the plasma under conditions which reduce the relative role of ions in the etch (as compared to neutrals in the etch); and essentially eliminating the magnetic field confinement in the transition zone of the etcher, i.e., the zone between the high density source and the wafer.

18 Claims, 4 Drawing Sheets

5,759,922

1

CONTROL OF ETCH PROFILES DURING EXTENDED OVERETCH

This application is a continuation of application Ser. No. 08/388,093, filed Feb. 14, 1995, now abandoned, which is a continuation-in-part of application Ser. No. 08/112,017, filed Aug. 25, 1993, now abandoned.

FIELD OF THE INVENTION

This invention relates to semiconductor manufacture, and more particularly to profile control when etching polysilicon or other conductive material disposed on a dielectric.

BACKGROUND OF THE INVENTION

The etching structures from polysilicon requires a process having a high degree of selectivity and anisotropy, without damaging the structure being formed. The problem is exacerbated by the requirements of sub-micron geometries.

Thus, various attempts have been made to achieve a highly selective anisotropic etch. See, for example, U.S. Pat. No. 5,336,365, entitled, "Polysilicon Etching Method," to Goda et al. in which bromine is added to the plasma in an attempt to enhance the etch.

Goda et al. also discuss the longfelt need to overcome the problem of notching. Notches were observed at the base of the structures formed through current processes. The notches are formed when highly selective conditions are used to etch polysilicon disposed on an oxide layer.

Schoenborn also discusses the state of the art in U.S. Pat. No. 5,242,536. With respect to the problem of chlorine etching, Schoenborn states that anisotropy and poly:oxide selectivity are possible with chlorine-based dry etching, but selectivity is compromised for profile control. Hence, there were persistent limitations to the current processes.

Such conditions occur during the over etch step. The notches have been a serious drawback to achieving a highly selective etch for sub-half micron polysilicon gate and other structures.

The notches are believed to be caused by long overetches in high density plasmas. The higher the electron density of the plasma, the larger the notches. Hence, one suggestion for eliminating the notches was the use of a plasma of low electron density having an RF bias in which the ions move along the vertical axis. A small amount of a deposition gas must be added to protect the line wall and increase selectivity. See, for example, "ECR Plasma Etching of N⁺ Polysilicon Gate," by T. Nozawa, et al. published in the Proceedings of the Electrochemical Society in 1993 on pages 356–357.

Hence, there still exists a need in the industry for a highly selective polysilicon to oxide etch which displays good anisotropy.

SUMMARY OF THE INVENTION

The present invention embodies a process and hardware design which substantially eliminates the profile control problem that is inherent to polysilicon etching in high density sources having a high selectivity between the polysilicon and the underlying oxide. The problem being the formation of a notch at the polysilicon-silicon dioxide interface during overetch. Therefore, a high density source can still be used.

The process of the present invention substantially prevents notching by: 1) operating the plasma under conditions which reduce the relative role of ions in the etch (as compared to neutrals in the etch); and 2) essentially eliminating the magnetic field confinement in the transition zone of the etcher, i.e., the zone between the high density source and the wafer.

The present invention has many advantages over the previous technology. One advantage is an increase in the amount of over etch time possible before the occurrence of any significant notching. The bits of conductive material remaining between structures, called "stringers," are more effectively removed by a longer over etch time. Therefore, the present invention results in a better, more robust process.

Another advantage of the present invention is that the etch process is successful when chlorine alone is used. Hence, the need to add oxygen or hydrogen bromide (HBr) to control the profile of the structure is essentially eliminated.

A further advantage of the present invention is that there is more process control, thereby enabling a more repeatable process, and a larger process window.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

The present invention is described and illustrated with respect to a submicron capacitor structure. However, one having ordinary skill in the art, upon being apprised of the present invention will appreciate its applicability to the formation of gate structures, as well as other processes, especially those processes which involve etching a polysilicon layer disposed over a layer of oxide or other dielectric.

Figure 1:
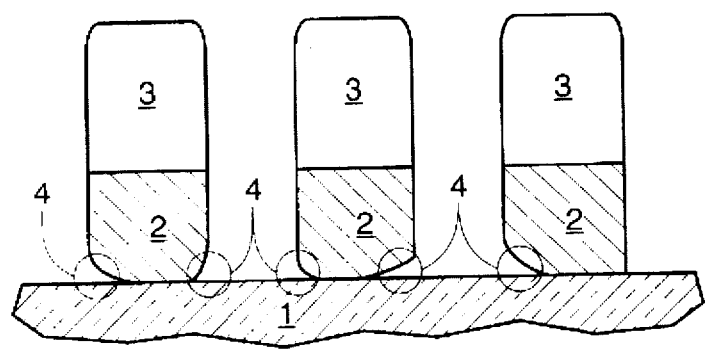
FIG. 1 is a schematic cross-section of a semiconductor feature illustrating the notching problem which occurs in current etch processes.

Referring to FIG. 1, a problem which occurs in the manufacture of semiconductors is illustrated. Undesirable notches 4 tend to form when submicron features are etched from a conductor, such as, polysilicon 2, disposed on an insulator, such as an oxide or a nitride 1.

The notches 4 tend to form along the oxide surface 2 when resist 3 or a hardmask (not shown), such as silicon dioxide or a conductive material, such as a metal, is used.

This situation has been observed when chlorine is one of the chemical etchants. Hence, it is believed that the notches 4 are caused by ion-type etching, as opposed to radical-type etching.

Under high selectivity conditions, chlorine ions are believed to be driven to the insulator surface 1, and remain thereon. As a result, there are many ions around the polysilicon features 1. Since there are negative charges at the bottom of the polysilicon features 1, the chlorine ions bombard the bottom of the polysilicon feature 1 along the oxide surface 2.

In the preferred embodiment of the present invention, a layer of polysilicon 2 is disposed on an insulating layer 1 of silicon dioxide. A mask 3 is patterned on the polysilicon 2 using a resist 3. A chlorine containing plasma is used to anisotropically etch the layers 1, 2.

An extended overetch is performed to eliminate stringers when the polysilicon layer 1 exists over a steep topography, for example, a stacked capacitor structure. The extended overetch lasts for approximately 2 minutes or more, and is referred to as a 300% overetch. The process of the present invention is especially useful when etching layers of polysilicon 2 disposed over a steep oxide 1 step having a high aspect ratio, for example at least 3:1, i.e., the height of the structure is at least three times the thickness of the polysilicon. See, for example, U.S. Pat. No. 5,449,433, entitled "Use of a High Density Plasma Source Having an Electrostatic Shield for an Isotropic Polysilicon Etching Over Topography", also to the present inventor.

The parameters used in high density source plasma etcher according to the present invention, enable the use of exclusive use of chlorine as an etchant, without the need for other etchant chemicals (such as, bromine or fluorine). In an alternative embodiment, an inert gas may be added.

Figure 2:
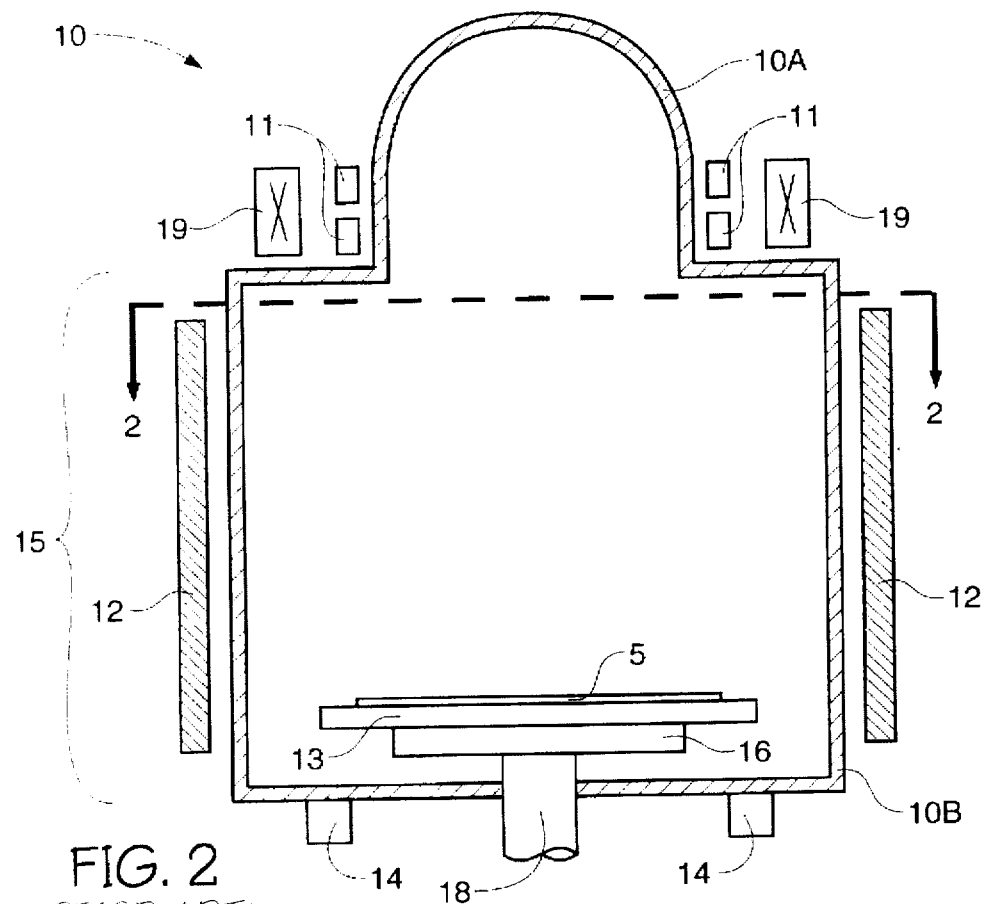
FIG. 2 is a schematic cross-section of a standard configuration of a high density source which causes the notching of FIG. 1.
Figure 2A:
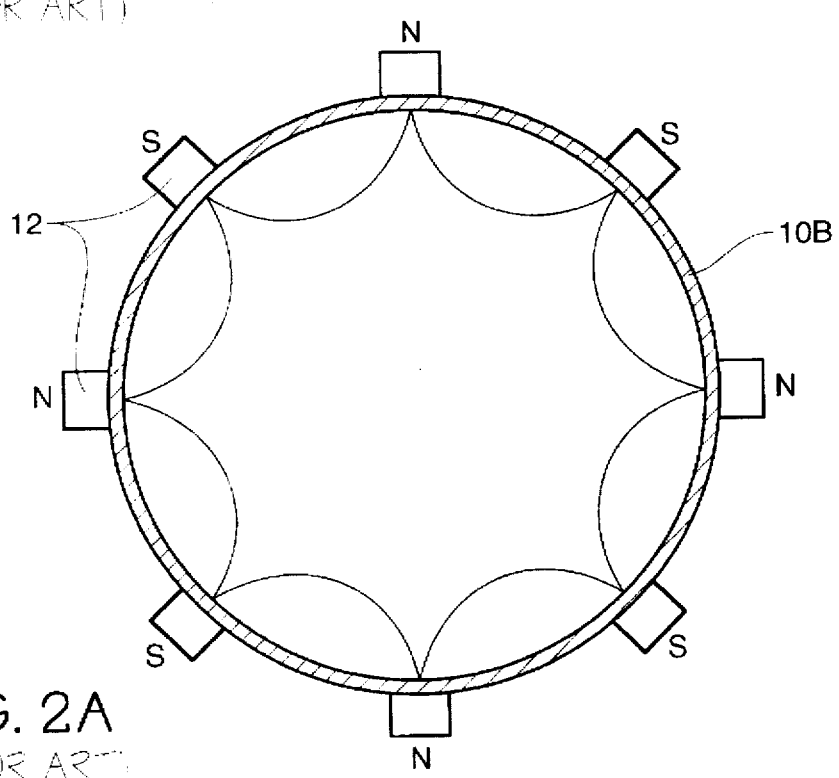
FIG. 2A is a schematic top-view of the high density source of FIG. 2 along line 2—2.

A schematic diagram of a high density plasma etching system is shown in FIGS. 2 and 2A. See, for example, U.S. Pat. No. 5,091,049, entitled, "High Density Plasma Deposition and Etching Apparatus" which describes high density source plasma etchers. Campbell et al. also discuss a variety of problems encountered with various etch tools.

In a high density plasma source, a wafer 5 is set at the center of a mirror magnetic field, and is cooled by helium gas using a backside cooling apparatus 16. The RF power 18 is applied to at the wafer holder 13. The high density plasma is generated by applying power to the antennae 11, and by using a separate electromagnet 19 to control electron motion inside the source 10A.

The bell jar or source plasma 10A generates ions and neutrals which etch the film 2. The RF bias power 18 located on the wafer chuck 13 is used to accelerate the ions as the ions drift down from the plasma source 10A into the vicinity of the wafer 5.

The remote source equipment which is currently marketed and used, typically possesses magnetic confinement in the "bucket" or transition zone 15. The confinement uses permanent magnets 12 to prevent electron and ion loss to the chamber walls 10B.

In addition, extra magnets 14, which can be permanent or electromagnetic, may be used to shape the magnetic field near the wafer 5 to help control plasma density and ion trajectory.

In order to obtain the desired etch profile and maintain the desired selectivities: 1) the correct amount of ions and reactive neutrals must be generated in the source plasma and impinge on the wafer surface; 2) the ions and reactive neutrals must be allowed to uniformly radially diffuse enough in the "bucket" to produce uniform results on the wafer. As the ions and neutrals diffuse, their concentration tends to decrease and their uniformity tends to improve; and 3) the RF bias on the wafer chuck can be used to control the energy of the ions that hit the wafer.

The greater the RF bias, the greater the energy imparted to the ions, and the lower the amount of chlorine which accumulates on the surface of the insulator 1. High bias results in decreased selectivity to oxide 1.

Figure 3:
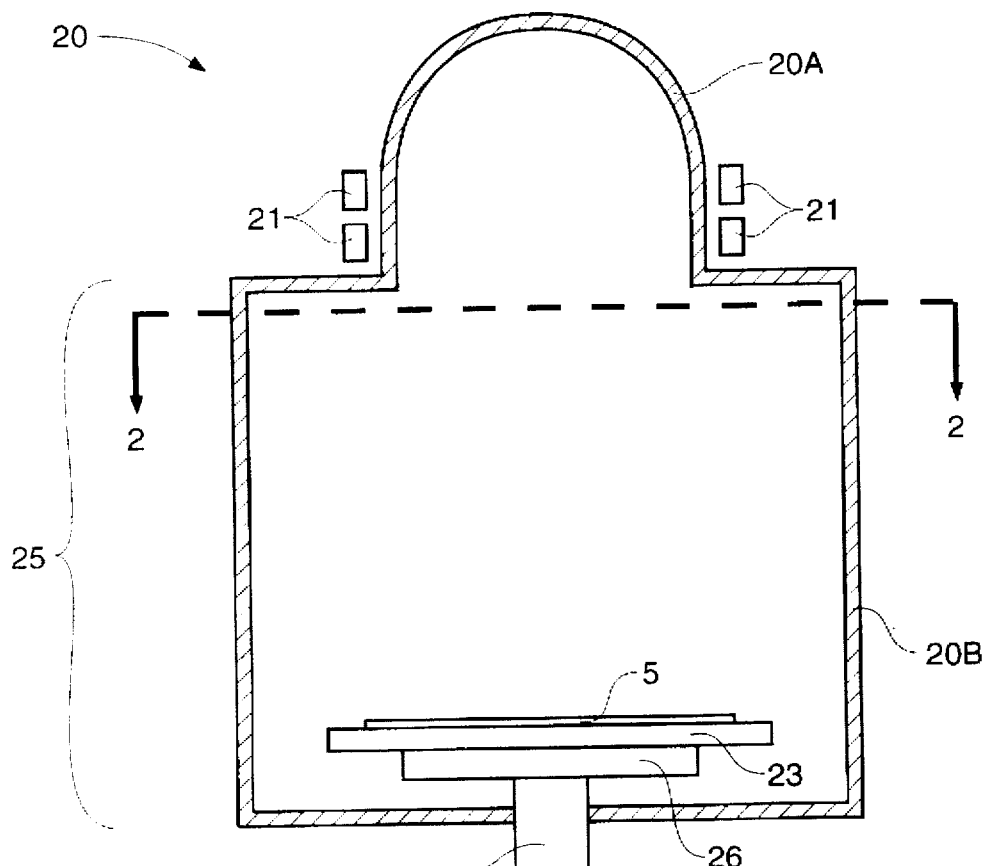
FIG. 3 is a schematic cross-section of the present invention in which the magnets are removed from the bucket/transition zone to change the conditions of the etch process according to the process of the present invention.
Figure 3A:
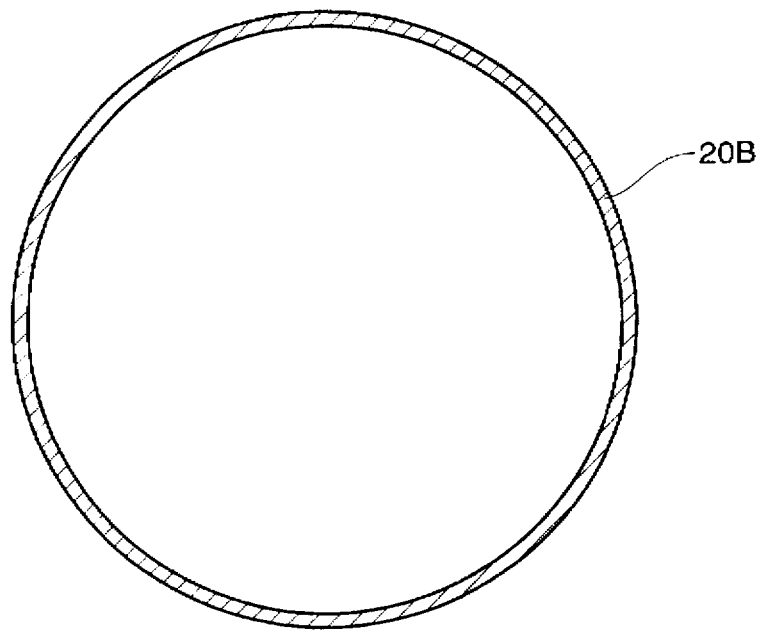
FIG. 3A is a schematic top-view of the present invention of FIG. 3 along line 3—3.

The present invention, as shown in FIGS. 3 and 3A, removes the magnets 12, 14, and 19 (as seen in FIGS. 2 and 2A) from the apparatus 20 thereby obtaining the correct balance of ions to reactive neutrals. This result was not possible simply by decreasing the plasma source nor by simply changing the pressure. Making the plasma source more inductive (inductive sources are more neutral rich compared to capacitive sources which tend to be more ion rich) did not eliminate the notches.

The conditions of the present invention permit the etch to proceed with minimal notch 4 formation. In the PMT (Plasma and Materials Technology) remote source etcher, such as, for example a "Mori Source Etcher," the conditions are to operate at higher pressure, such as, for example, 3.5 mtorr. The previous processes used a pressure in the range of 2.0 mtorr.

The present invention also employs a lower top power, such as, for example, 1750 watts. Instead of the 3000 watts common in previous approaches. The present invention also eliminates the permanent magnets 12 (as shown in FIGS. 2 and 2A) from the "buckets" or transition zone 25.

With respect to the etch parameters, the dominant effect is power. Pressure is a less important effect. For example, low power will work without pressure, but no pressure will work if the power is too high. In accordance with the present invention, a high density source has a pressure in the approximate range of 1 to 4 mtorr and a top power in the approximate range of 500 to 3000 watts.

The removal of the magnets 12 deceases the ion flux relative to the flux of the reactive neutrals. The flux refers to amount of etchant that impacts the wafer per unit time per unit area. The ion flux is often measured in ions/ ($cm^2sec$).

The magnetic field only affects the motion of the ions, and does not affect the motion of the reactive neutrals. Thus the removal of the magnets 12 results in a lower ratio of ions to reactive neutrals than can be generated by the plasma source 20A. Removal of the magnets also decreases the ion flux.

One embodiment of the present invention is to reduce the ion concentration of a plasma without reducing the concentration of the reactive neutrals. Use of the process of the present invention has shown that the plasma effluent, which etches the wafer 5, changes ion density when the magnetic field confinement is eliminated. Effluent describes the material which comes from plasma source and enters into the transition zone 25. The notch 4 formation also changes, i.e., is substantially eliminated.

The mechanism appears to be a reduction of the ion to neutral ratio in the effluent of the source plasma, specifically in this case, the ratio of chlorine ions to chlorine atoms.

With continuing reference to FIG. 3 and by comparison with high density plasma etcher 10 of FIG. 2, electromagnet 19 and extra magnets 14, along with magnets 12, are removed from etcher 20 to provide an inductive plasma source in accordance with the present invention. Thus, antennae 21 is employed for high density plasma generation without magnetic confinement from magnet 19. Plasma is generated by applying a power to antennae 21 to apply energy to one or more gases in plasma source 20A.

Figure 4:
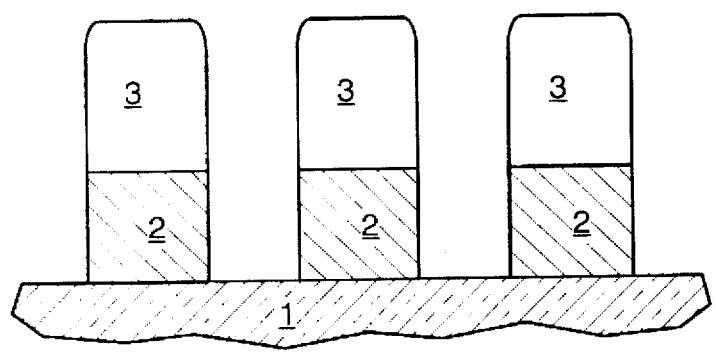
FIG. 4 is a schematic cross-section of the semiconductor feature of FIG. 1 without the notches, formed according to the present invention.

FIG. 4 is a schematic cross-section of the semiconductor feature 2 made with the process of the present invention.

All of the patents cited herein are hereby incorporated by reference as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

One having ordinary skill in the art will realize that the concepts of the present invention are applicable to the etching of conductive features, especially when the features are disposed on an insulating or a dielectric material.

The present invention is also useful to minimize notching in other types of etches, if the notching occurs due to the presence of chlorine in the etchant gases.

What is claimed is:

1. A method for etching a wafer having an exposed polysilicon layer over an oxide layer, the method comprising the steps of:
   providing a high density plasma, Mori source etcher having a source plasma chamber, the source plasma chamber having an antenna and having an inductive plasma source;
   generating a plasma in the source plasma chamber with the inductive plasma source, the plasma generation comprising applying top power in a range of 500 to 3000 watts and pressure in a range of 1 to 4 mtorr;
   providing a transition zone without magnetic confinement configured to receive the plasma and to provide a plasma effluent, the plasma effluent having ions and neutrals;
   passing the ions and the neutrals through the transition zone to decrease the ions to the neutrals ratio of the plasma effluent;
   directing ions of the plasma effluent to the wafer with a radio frequency bias in operational proximity to the wafer; and
   anisotropically etching the polysilicon layer without substantially etching the oxide layer to form a functional structure.

2. A method, as in claim 1, wherein the plasma effluent comprises chlorine ions and chlorine atoms.

3. A process of etching a wafer having an exposed polysilicon layer over an oxide layer, the polysilicon layer and the oxide layer forming a junction at an intersection thereof, the process comprising the steps of:
   providing a high density plasma, Mori source etcher having a source plasma chamber and a transition zone chamber, the source plasma chamber having an antenna and having an inductive plasma source;
   generating a plasma in the source plasma chamber with the inductive plasma source the plasma generation comprising applying a top power in a range of 500 to 3000 watts and pressure in a range of 1 to 4 mtorr;
   providing the transition zone chamber without magnetic confinement configured to receive the plasma and to provide a plasma effluent, the plasma effluent having ions and neutrals;
   passing the ions and the neutrals through the transition zone chamber to decrease the ions to the neutrals ratio of the plasma effluent;
   etching the wafer with the plasma effluent;
   the plasma effluent selective to etch the polysilicon layer and to substantially not etch the oxide layer; and
   the plasma effluent during the etching step having an ion concentration to reactive neutral concentration characterized by a substantial elimination of notching of the polysilicon layer at the junction.

4. A process, as in claim 3, wherein the plasma effluent includes chlorine.

5. A process, as in claim 4, wherein the plasma effluent includes an inert gas.

6. A process, as in claim 4, wherein the plasma effluent does not include oxygen.

7. A process, as in claim 4, wherein the plasma effluent does not include bromine.

8. A process, as in claim 4, wherein the plasma effluent does not include fluorine.

9. A process, as in claim 4, wherein the oxide layer comprises silicon dioxide.

10. A process of etching a wafer having an exposed selected layer of material over a non-selected layer of material, the non-selected layer and the selected layer forming a junction at an intersection thereof, the process comprising the steps of:
    delivering only a single element gas to an inductive plasma source chamber of a high density plasma, Mori source etcher;
    generating a plasma effluent having ions and neutrals from the single element gas the plasma generation comprising applying a top power in a range of 500 to 3000 watts and pressure in a range of 1 to 4 mtorr;
    passing the ions and the neutrals through a region without magnetic confinement to decrease the ions to the neutrals ratio of the plasma effluent;
    distributing the plasma effluent to the wafer;
    etching the wafer with the plasma effluent; and
    the plasma effluent selective to etch the selected layer without substantially etching the non-selected layer, and during the etching, the plasma effluent having a ratio of ion concentration to reactive neutral concentration characterized by a substantial elimination of notching of the selected layer at the junction.

11. A process, as in claim 10, wherein the single element gas consists of chlorine.

12. A process of etching a wafer having a non-selected layer below a selected layer forming a junction at an intersection thereof, the process comprising the steps of:
    delivering gas to an inductive plasma source chamber of a high density plasma, Mori source etcher;
    generating a plasma in the gas to provide a plasma effluent having ions and neutrals, the plasma generation comprising applying a pressure in a range of 1 to 4 mtorr and a top power in a range of 500 to 3000 watts;
    passing the plasma effluent through a region without magnetic confinement to decrease the ions to the neutrals ratio; and
    etching the wafer with the plasma effluent, the plasma effluent having an ion concentration to reactive neutral concentration characterized by a substantial elimination of notching of the selected layer at the junction;
    the plasma effluent selective for etching the selected layer and substantially not etching the non-selected layer.

13. A process, as in claim 12, further comprising the step of using chlorine gas to generate the plasma.

14. A process, as in claim 13, further comprising the step of employing an inert gas to provide the plasma effluent.

15. A process, as in claim 13, wherein the gas does not include oxygen.

16. A process, as in claim 13, wherein the gas does not include bromine.

17. A process, as in claim 13, wherein the gas does not include fluorine.

18. A process, as in claim 12, wherein the selected layer is made of polysilicon, and the non-selected layer is made of silicon dioxide.

* * * * *